Figure 1:
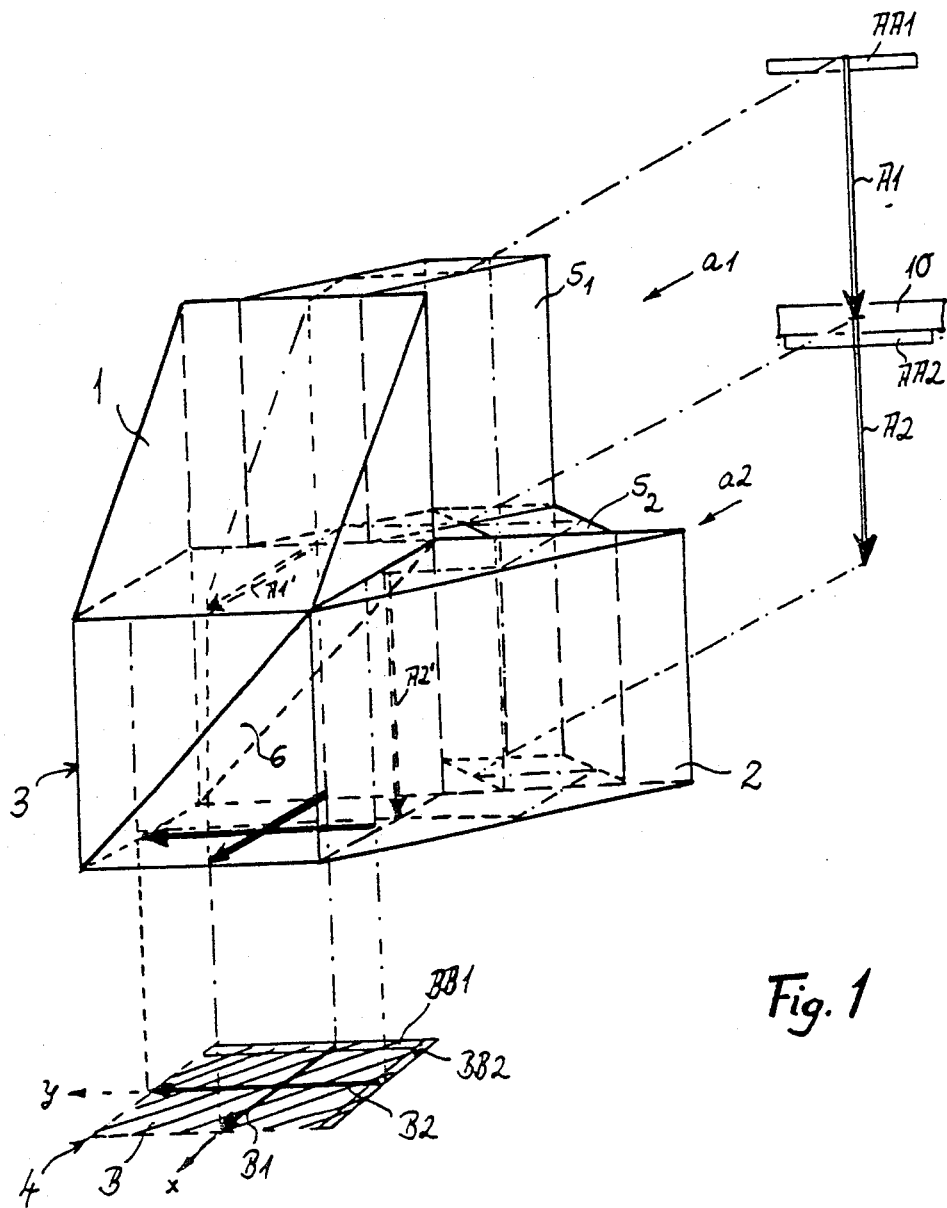

United States Patent [19]

Kaiser

[11] Patent Number: 4,834,499
[45] Date of Patent: May 30, 1989

[54] OPTICAL DEVICE FOR FORMING CROSSED LINEAR IMAGE ELEMENTS

[75] Inventor: Paul Kaiser, Munich, Fed. Rep. of Germany

[73] Assignee: Karl Süss KG, GmbH & Co., Munich, Fed. Rep. of Germany

[21] Appl. No.: 52,448

[22] Filed: May 19, 1987

[30] Foreign Application Priority Data

May 20, 1986 [DE] Fed. Rep. of Germany ....... 3616960

[51] Int. Cl.$^4$ .................. G02B 27/10; G02B 5/04
[52] U.S. Cl. .................... 350/174; 350/286
[58] Field of Search .............. 350/174, 173, 171, 286, 350/287, 6.1–6.8

[56] References Cited

U.S. PATENT DOCUMENTS

| | | | |
|---|---|---|---|
| 3,718,761 | 2/1973 | Myer | 350/6.8 |
| 4,191,477 | 3/1980 | Schick | 350/173 |
| 4,209,224 | 6/1980 | Stewart | 350/6.6 |
| 4,504,147 | 3/1985 | Huang | 356/353 |
| 4,689,780 | 8/1987 | Ohara et al. | 350/286 |
| 4,694,447 | 9/1987 | Cohen et al. | 350/174 |

FOREIGN PATENT DOCUMENTS

| | | | |
|---|---|---|---|
| 556426 | 10/1943 | United Kingdom | 350/173 |
| 638372 | 6/1950 | United Kingdom | 350/173 |

Primary Examiner—Jon W. Henry
Attorney, Agent, or Firm—Parmelee, Bollinger & Bramblett

[57] ABSTRACT

In the described optical device a linear object element forms an image by two straight lines crossing each other at a specific angle. Thus it is possible to achieve a crosswise movement of the image point downstream of the optical device with only a single linear scanning movement upstream of the optical device. In particular it is possible to scan plane structures with a single scanning movement.

19 Claims, 2 Drawing Sheets

Fig. 2a.
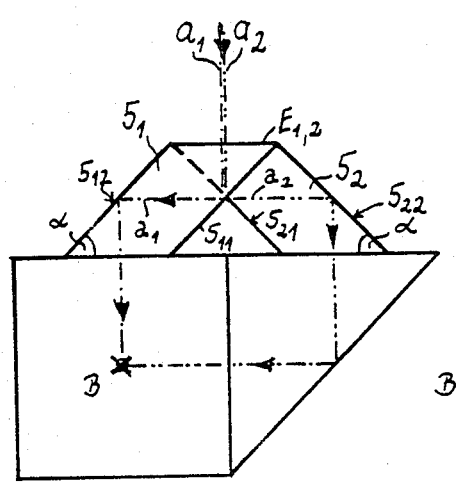
Fig. 2b.
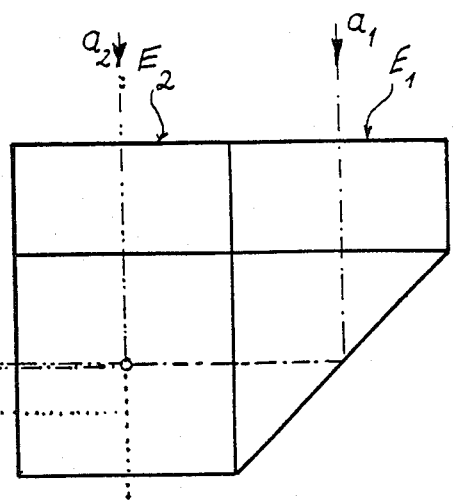
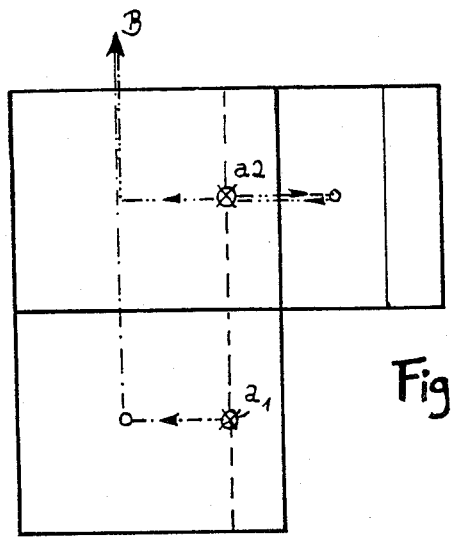
Fig. 2c.

OPTICAL DEVICE FOR FORMING CROSSED LINEAR IMAGE ELEMENTS

For adjusting instruments or construction elements, and in particular for adjusting masks and semiconductor discs (wafers) in the manufacture of semiconductor components, such as integrated circuits (IC), a light spot or light band is led crosswise over marking points which have to be adjusted to each other. In order to optimize the alinement, for example by visual observation or automatically by means of detectors and a loop, complementary reticules may be provided on the substrate and the mask (see German Auslegeschrift 24 21 509 and German Pat. No. 27 08 674). This requires a comparatively large light source, since the cross-section of the beam in the area of the mask and the substrate must approximately correspond to the dimensions of the markings (reticules) so as to illuminate the entire marking. This requirement makes it difficult to use laser light sources of small beam cross sections which have the advantage of emitting monochromic and coherent radiation.

The present inventors found that laser light sources and, in general, light sources with comparatively small beam cross-section can be used when this beam is "passed" over (scans) the markings or reticules, e.g. crosswise scans the markings.

Now in order to produce this crossed scanning movement, the light source would have to be moved in one plane in two different directions. This necessitates two motors for the movement of the light source or a suitable beam deflecting system; in some cases it will additionally be necessary to synchronise these two movements. This involves considerable mechanical and optical expenses, in particular since, already by definition, this kind of adjusting means is required to be highly exact.

The object of the present invention is to provide an optical device for forming an image in the shape of crossed linear image elements which allows to simplify the movement of the incident beam.

This problem is solved by the features of the patent claims.

The idea underlying the solution of the invention is to generate the crossed linear image elements from associated linear object elements by a suitable arrangement of the claimed optical device, with the object elements being not crossed but being arranged parallel to each other and preferably being joined to each other in the same direction or being at least partly superposed. In the preferred second alternative the two object elements which are located on a common straight line are imaged in the form of two crossed image elements. In the first alternative the two object elements are parallel to each other, i.e. here again it is sufficient to have an unidirectional movement of two light spots at a defined distance in order to form the crossed image elements. In the first discussed, preferred second alternative it is even possible within the scope of the invention to provide in place of two object elements arranged on a common straight line, only a single linear object element which is first split by a beam splitter, such as a semitransparent mirror or a corresponding prism arrangement, into two intermediate image elements which are parallel to each other. Similar to the other alternative, these two intermediate image elements are first rotated to each other and then superimposed downstream of the optical device so that straight image elements crossing each other are obtained in a common image plane.

For constructing the optical device of the invention there can be used for example conventional beam splitters (such as semitransparent mirrors or two superposed ridge prisms with semitransparent interface) or rhombic prisms as parallel offsetting means, ridge prisms or mirrors for deflecting the beam paths and beam splitters tilted to each other as beam superposing means.

In the embodiment illustrated in the drawing there are exclusively used prisms for constructing the optical device of the invention, the 90° ridge prisms causing an angle of 90° between the two image elements.

The optical device of the invention is preferably selected in such a way that the optical path lengths for the imaging of the two object elements onto the focal plane are the same so that for both optical path lengths the incident focusing is maintained.

With the optical device of the invention it is possible, by means of an incident light patch moving in a straight line, to scan downstream of the optical device the X-direction or Y-direction, either at the same time or successively, depending on how the incident beam splitter is formed. Thus, upstream of the optical device, a single scanning movement in a straight line is sufficient to produce a crosswise movement of the beam downstream of the optical device. Thus it is possible to dispense with a second upstream scanner, e.g. perpendicular to the movement of the single scanner, so that a possible synchronisation of the two scanners, as required in the prior art, is not necessary in the device of the invention since such "synchronisation" is automatically achieved.

Furthermore, since the optical device of the invention does not comprise any movable parts, it is sufficient to once exactly adjust the different optical construction elements in order to scan downstream of the optical device with highest repeatability with a single upstream scanner.

The expression "patch of light" of the incident light beam stands for different forms and cross-sections of the incident light beam, e.g. a light spot or a light band extending transversely to the scanning direction so that in both discussed cases there is progressively scanned in two directions a light cross or a square or rectangular area downstream of the optical device.

The invention is further illustrated with reference to the enclosed drawing:

FIG. 1 shows a perspective view of an optical device according to the invention comprising several different prisms, FIGS. 2a–2c show a plan, a side view and a front view, respectively, of the optical device according to FIG. 1.

The embodiment of an optical device according to the invention as shown in the drawing, which consists of several suitably arranged prisms, is in the following called X-Y prism. The X-Y prism in this embodiment forms two vertically crossing image elements B1 and B2 from a straight object A1, A2. Starting from the object A1, A2, the beam path for the different object elements A1 and A2 first hits a beam splitter with parallel offsetting means $5_1$ and $5_2$ which separates the beams path a1 and a2 of the two object elements A1 and A2 from each other in the axial direction of the object (see FIG. 2a) whereby they are formed into parallel beams. For this purpose the beam splitter with parallel offsetting means consists of two prisms $5_1$ and $5_2$ each having a rhombic cross-section. The beam entrance faces $E_1$ and $E_2$ of the prisms are arranged in such a way that they are vertical to the beam paths $a_1$ and $a_2$ in a common plane. After passing through the entrance faces $E_1$ and $E_2$, the beams $a_1$ and $a_2$ are totally reflected on the respective opposite prism faces $5_{11}$ and $5_{21}$ of the two prisms $5_1$ and $5_2$ (in the illustration of FIG. 2a towards the left-hand side and the right-hand side, respectively). Subsequently they are again totally reflected on the respective opposite prims faces $5_{12}$ and $5_{22}$ and according to FIG. 2a they are then parallel to each other. In order for the beam splitting and parallel offsetting to be geometrically right, each of the two rhombic prisms $5_1$ and $5_2$ has a rhombic angle $\alpha = 45°$.

These parallel offsetting means $5_1$ and $5_2$ could be dispensed with, if the two superposed object elements A1 and A2 were replaced by two object elements arranged side by side which are moved together, i.e. parallel to each other.

After parallel offsetting the two object elements A1 and A2 in the prisms $5_1$ and $5_2$ the two beam paths $a_1$ and $a_2$ enter into ridge prisms 1 and 2, respectively, which are rotated by 90° (intermediate images A1' and A2', respectively). In order to ensure that the two beam paths are again imaged in a common focal plane, there is arranged downstream of the two ridge prisms 1 and 2 a common beam superposing means 3 in the form of a beam splitter rotated by 90°, the semitransparent interface 6 of which is transparent for the beam path a1 and reflects the beam path a2 so that the beams a1 and a2 exit downwards in FIG. 1 and downwards vertical to the plane of the paper in FIG. 2a.

Different parallel beam paths a1 starting from different object points on the linear object element A1 form the image element B1 downstream of the optical device. Correspondingly there is formed the linear image element B2, which crosses the linear image element B1 at an angle of 90°, downstream of the optical device by different parallel beam paths a2 starting from different object points on the linear object element A2.

When the object elements which are upstream of the optical device are suitably modified, the inventive X-Y prism images a plane structure: for example, if a light beam AA1 is moved first over the distance A1 and then as light band AA2 over the distance A2, there is first formed downstream of the optical device an image BB1 of the light band AA1 which moves in the direction of the arrow over the distance B1. Secondly, in FIG. 1 the image BB2 which moves towards the left over the distance B2 in the direction of the arrow is formed by the incident light band AA2 over the distance A2. By this the hatched area B is first scanned in the X-direction and then in the Y-direction.

In order to avoid a diffraction or interference of the two beam paths a1 and a2 at the junction between the two object elements A1 and A2 there may be provided a suitable shield 10 so that the two object elements A1 and A2 are not continuously joined but are interrupted.

As explained above, it is also possible to split a single object element in a conventional beam splitter, such as semitransparent mirrors or semitransparent interface between two prisms, to suitably parallel offset it and finally to superpose it in such a way that a crossed image of a single object element is formed just as in the Figure shown in the drawing. In this case it might be possible to dispense with the parallel offsetting means $5_1$ and $5_2$.

According to the invention, the prisms shown in the drawing can be substituted by mirrors or semitransparent mirrors.

If the angle between the two image elements B1 and B2 is to be other than a 90° angle it is only necessary to change the angles of the prisms or the angles of the correspondingly used mirrors in a suitable way.

I claim:

1. Optical device for forming an image in the form of crossed linear image elements from an object consisting of first and second linear object elements which are arranged substantially parallel to each other, said optical device comprising:
   (a) a first beam deflecting means for rotating a beam path for the first object element; and
   (b) a beam superposing means arranged in a beam path of the first and second object elements downstream of the first beam deflecting means for directing the two beam paths to a common image area to form crossed linear image elements.

2. Optical device according to claim 1 wherein:
   (a) the two object elements are arranged so as to extend one-dimensionally in the same direction; and
   (b) upstream of the beam deflecting means there are provided a beam splitter and at least in one of the split beam paths a parallel offsetting means.

3. Optical device for imaging onto a common image area two object sections of a planar object to be imaged in the form of crossed linear image elements, said optical device comprising two object sections are of a planar object to be imaged, the two object sections being spaced parallel to each other and an image of the one object section and an image of the other object section are rotated relative to each other, and including a plane face system comprising:
   (a) a first and a second beam deflection means for rotating the two object sections relative to each other; and
   (b) a beam superposing means downstream of the beam deflection means for superposing the two beam paths rotated reltive to each other to form crossed linear image elements.

4. Optical device according to claim 3, wherein the rotation angle between the two images of the object sections is 90°.

5. Optical device according to claim 3 wherein:
   (a) the two object sections are arranged so as to extend one-dimensionally in the same direction; and
   (b) upstream of the beam deflection means there are provided a beam splitter and at least in one of the split beam paths a parallel offsetting means.

6. Optical device according to claim 4 wherein:
   (a) the two object sections are arranged so as to extend one-dimensionally in the same direction; and
   (b) upstream of the beam deflection means there are provided a beam splitter and at least in one of the split beam paths a parallel offsetting means.

7. Optical device for forming an image in the form of crossed linear image elements from an object consisting of first and second linear object elements which are arranged substantially parallel to each other and extend one-dimensionally in the same direction, said optical device comprising:
   (a) a first beam deflecting means for rotating a beam path for the first object element;
   (b) a beam superposing means arranged in a beam path of the first and second object elements downstream of the first beam deflecting means for directing the two beam paths to a common image area to form crossed linear image elements; and (c) upstream of the beam deflecting means, a beam splitter with parallel offsetting means which consists of two complementary rhombic prisms which are spaced apart from each other and in at least one of the split beam paths a parallel offsetting means.

8. Optical device according to claim 7, wherein downstream to each of the rhomic prisms there is provided a prism having a triangular cross-section as the beam deflecting means.

9. Optical device according to claim 7, characterized in that a beam splitter is the beam superposing means.

10. Optical device according to claim 8, characterized in that a beam splitter is the beam superposing means.

11. Optical device having a plane face system for imaging onto a common image area two object sections of a planar object to be imaged, wherein the two object sections are spaced parallel to each other and extend one-dimensionally in the same direction and images of the one object section and of the other object section are rotated relative to each other, the plane face system comprising:

(a) a first and a second beam deflection means for rotating beam paths of the two object sections relative to each other;

(b) a beam superposing means downstream of the beam deflection means for superposing the two beam paths rotated relative to each other; and (c) upstream of the beam deflection means, a beam splitter with parallel offsetting means which consists of two complementary rhombic prisms which are spaced apart from each other and in least one of the split beam paths a parallel offsetting means.

12. Optical device according to claim 11, wherin downstream to each of the rhombic prisms there is provided a prism having a triangular cross-section as the beam deflecting means.

13. Optical devie according to claim 11, characterized in that a beam splitter is the beam superposing means.

14. Optical device according to claim 12, characterized in that a beam splitter is the beam superposing means.

15. Optical device having a plane face system for imaging onto a common image area two object sections of a planar object to be imaged, wherein the two object sections are spaced parallel to each other and extend one-dimensionally in the same direction and images of the one object section and of the other object section are rotated relative to each other, the plane face system comprising:

(a) a first and a second beam deflection means for rotating the two object sections relative to each other wherein the rotation angle between the two images of the object sections is 90°;

(b) a beam superposing means downstream of the beam deflection means for superposing the two beam paths rotated relative to each other; and (c) upstream of the beam deflection mens a beam splitter with parallel offsetting means which consists of two complementary rhombic prisms which are spaced apart from each other and in at least one of the split beam paths is a parallel offsetting means.

16. Optical device according to claim 15, wherein downstream to each of the rhombic prisms there is provided a prism havig a triangular cross-section as the beam deflecting means.

17. Optical device according to claim 16, characterized in that a beam splitter is the beam superposing means.

18. Optical device according to claim 15, characterized in that a beam splitter is the beam superposing means.

19. Plane face system for the imaging to scale onto a common image area of two adjacent sections of a planar object, wherein images of the first object section and second object section coincide in the same image area and are rotated to each other at 90°, and wherein the plane face system comprises:

(a) on the object side two offsetting means which are arranged on top of and parallel to each other and which have parallelogram-shaped cross-sections, contacting surfaces of the two offsetting means forming an isosceles triangle and having entrance faces facing the object;

(b) an upper and a lower right-angle ridge prism as beam deflection means on the object side, coplanar catheti faces of which contact the respective associated parallel offsetting means and second catheti faces of which meet vertically at an edge; and (c) a cube prism on the image side as beam superposing means, located in a space defined by two vertically meeting catheti faces of the two right-angle ridge prisms, said cube prism having a semi-transparent, diagonal face passing through an edge of said two catheti faces.

* * * * *